(12) United States Patent
Ramarajan et al.

(10) Patent No.: US 7,435,324 B2
(45) Date of Patent: *Oct. 14, 2008

(54) NONCONTACT LOCALIZED ELECTROCHEMICAL DEPOSITION OF METAL THIN FILMS

(75) Inventors: Suresh Ramarajan, Boise, ID (US); Whonchee Lee, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 515 days.

This patent is subject to a terminal disclaimer.

(21) Appl. No.: 10/933,823

(22) Filed: Sep. 2, 2004

(65) Prior Publication Data

US 2006/0042953 A1     Mar. 2, 2006

(51) Int. Cl.
*C25D 5/02* (2006.01)

(52) U.S. Cl. ...................... 205/118; 205/157

(58) Field of Classification Search ........... 205/123, 205/134, 136, 147; 204/280
See application file for complete search history.

(56) References Cited

U.S. PATENT DOCUMENTS

| | | | |
|---|---|---|---|
| 3,303,111 A * | 2/1967 | Peach | 205/258 |
| 4,153,531 A | 5/1979 | Faul et al. | |
| 5,641,391 A * | 6/1997 | Hunter et al. | 205/80 |
| 5,660,706 A | 8/1997 | Zhao et al. | |
| 6,120,669 A | 9/2000 | Bradley | |
| 6,121,152 A | 9/2000 | Adams et al. | |
| 6,132,586 A | 10/2000 | Adams et al. | |
| 6,143,155 A * | 11/2000 | Adams et al. | 205/87 |
| 6,855,239 B1 * | 2/2005 | Jairath | 205/80 |
| 7,001,498 B2 * | 2/2006 | Colgan et al. | 205/133 |
| 7,153,777 B2 * | 12/2006 | Lee | 438/692 |
| 2007/0000786 A1 * | 1/2007 | Ramarajan et al. | 205/118 |

* cited by examiner

*Primary Examiner*—Edna Wong
*Assistant Examiner*—Luan V Van
(74) *Attorney, Agent, or Firm*—TraskBritt

(57) ABSTRACT

A method of selectively electroplating metal features on a semiconductor substrate having a conductive surface. An electrode assembly that includes a plurality of adjacent, mutually spaced and electrically isolated electrodes connected in series so as to be oppositely polarized when a voltage is applied thereacross is positioned over the substrate and an electrolyte solution is applied to the conductive surface. The electrode assembly and the conductive surface may be positioned in close proximity to, but without contacting, one another. A voltage is applied to the electrode assembly, which causes a metal film to selectively form on portions of the conductive surface that are positioned beneath an electrode exhibiting a positive polarity and, thus, negatively charged. Portions of the conductive surface positioned beneath electrodes exhibiting a negative polarity remain unplated. A DC power supply may be employed, the electrode polarity in such case being fixed or, alternatively, an AC power supply may be employed so as to cyclically vary electrode polarity and cause metal deposition beneath each electrode. An electroplating system is also disclosed.

19 Claims, 2 Drawing Sheets

NONCONTACT LOCALIZED ELECTROCHEMICAL DEPOSITION OF METAL THIN FILMS

FIELD OF THE INVENTION

The present invention relates to electrochemical deposition of a metal film. More specifically, the present invention relates to a noncontact method of selectively electrochemically depositing metal features of a desired size and shape and at desired locations on a surface of a substrate, such as a semiconductor substrate.

BACKGROUND OF THE INVENTION

To fabricate integrated circuits, multiple conductive layers are formed on semiconductor substrates to provide electrical contact between conductive components on the semiconductor devices. Since the dimensions of semiconductor devices have dropped below one micron design rules, the conductive layers are used to accommodate higher densities. The conductive layers are typically metal layers or metal features that are formed by chemical vapor deposition ("CVD"), physical vapor deposition ("PVD"), atomic layer deposition ("ALD"), or other electrodeposition techniques, such as electroplating or electroless deposition. To electroplate the metal feature, a seed layer is formed on a surface of the semiconductor substrate. The semiconductor substrate is directly attached to a positive electrode and a negative electrode. The surface of the semiconductor substrate is then plated with a desired metal by applying a voltage through the electrodes while an electrolyte solution containing the metal to be plated is flowed over the semiconductor substrate. The metal is electroplated onto the entire surface of the semiconductor substrate.

Electroplating is commonly used to form interconnect lines and vias in multilayer metal structures in a damascene process. Electroplating the interconnect lines and vias is one of many steps in fabricating the integrated circuits. In the damascene process, trenches are formed in the semiconductor substrate and are filled with a metal, such as copper, aluminum, or tungsten. After the metal is plated, the semiconductor substrate is polished, leaving the metal interconnect in the trench areas. One disadvantage with the damascene process is that since the entire surface of the semiconductor wafer is covered with the metal, undesired portions of the metal must be removed by polishing. A second disadvantage is that the metal is deposited nonuniformly on the semiconductor substrate because the electrodes are connected to edges of the semiconductor wafer, which causes a drop in potential towards the center of the semiconductor wafer.

Bipolar electrochemical processes have also been developed in which the desired metal is deposited on the semiconductor substrate without contact between the electrodes and the semiconductor substrate. For instance, U.S. Pat. No. 6,120,669 to Bradley discloses a bipolar electrochemical process that is used to toposelectively deposit a metal, such as a metal wire, between two metal particles. In addition, a method of plating metal interconnections on a semiconductor wafer using a bipolar electrode assembly is disclosed in U.S. Pat. No. 6,132,586 to Adams et al. A metallized surface of the semiconductor wafer is positioned opposite an anode and cathode of the bipolar electrode assembly. An electroplating solution of a metal to be plated is then flowed between the anode and a cathode and the metallized surface of the semiconductor wafer. A voltage is applied between the electrodes to plate the metal on the metallized surface of the semiconductor wafer. Relative motion is also provided between the bipolar electrode assembly and the semiconductor wafer while the voltage is applied. By moving the bipolar electrode assembly over the surface of the semiconductor wafer, electroplating of the metal is localized to a small area on the semiconductor wafer surface and provides more uniform deposits. The bipolar electrode assembly also enables one side of the semiconductor wafer to be simultaneously plated and deplated (electropolished). By applying a positive potential through the anode and a negative potential through the cathode, an area under the anode is electroplated while the area under the cathode is deplated.

BRIEF SUMMARY OF THE INVENTION

The present invention relates to a method of selectively electroplating metal features on a semiconductor substrate. Exemplary metal features may include bond pads, redistribution layers or other traces, damascene structures and interconnects for same, and other conventional metal features found in semiconductor devices, which are formed presently by other techniques. The method comprises providing an electrode assembly that includes a plurality of adjacent, mutually spaced and electrically isolated electrodes connected in series so as to be oppositely polarized when a voltage is applied thereacross. As used herein, the terms "positive" and "negative" are respectively used to identify individual electrodes exhibiting that given polarity at a particular time. An insulating material may also be interposed between each of the plurality of electrodes. The electrode assembly is positioned over a conductive surface of a substrate and an electrolyte solution is applied to the substrate surface. The electrode assembly and the substrate surface may be positioned in close proximity to one another with the plurality of electrodes to be of positive polarity positioned over, but not in contact with, the surface at locations where the metal features are to be formed. A DC voltage may be applied to the electrode assembly, which may generate a fringe electric field that passes through the conductive surface of the substrate between adjacent positive and negative electrodes of the plurality. The fringe electric field may cause negatively charged cathodic portions to form on the substrate surface beneath the plurality of positive electrodes and positively charged anodic portions to form on the conductive surface of the substrate beneath the plurality of negative electrodes. A metal film is deposited from the electrolyte solution on the negatively charged cathodic portions of the conductive surface of the substrate that are positioned beneath the plurality of positive electrodes in a configuration corresponding to that of the positive electrodes, while portions of the substrate surface that are positioned beneath the plurality of negative electrodes may remain unplated. Instead of a DC voltage, an AC voltage may also be applied to the electrode assembly, thus varying the polarity of each electrode with each voltage cycle and reversal of polarity, by which metal features may be deposited beneath each electrode as it is caused to exhibit a positive polarity. The metal film may comprise any of nickel, copper, cobalt, platinum, aluminum, silver, gold, chromium, iron, zinc, cadmium, palladium, platinum, tin, and bismuth.

The present invention also relates to an electroplating system that comprises a plurality of adjacent, electrically isolated electrodes connected in a series so as to be oppositely polarized when a voltage is applied thereacross. A power supply is placed in communication with the plurality of electrodes, which may be insulated from each other by an interposed insulating material, such as an epoxy. The plurality of electrodes may, in combination, be configured to produce a fringe electric field when a voltage is applied thereto by connecting the plurality of electrodes to the power supply in an alternating polarity pattern. The power supply may be an AC power supply or a DC power supply. As noted above, if an AC power supply is used and an AC voltage is applied to the electrodes of the assembly, each electrode is alternately of positive and negative polarity, enabling metal deposition beneath each electrode.

The electroplating system may also include a chuck or platen on which a substrate having a conductive surface upon which metal features are to be selectively plated is supported. The electrode assembly is supported using an electrode support over the chuck or platen in selected alignment in the horizontal (X-Y) plane and rotationally about a vertical (Z) axis perpendicular thereto with the substrate and, more specifically, with semiconductor die locations thereon. The conductive surface of the substrate may be positioned in close proximity to the electrode assembly, such as from approximately 0.1 mm to approximately 1 cm away from the electrode assembly and aligned therewith to cause the pattern of plated metal features to be precisely located and configured.

BRIEF DESCRIPTION OF THE SEVERAL VIEWS OF THE DRAWINGS

While the specification concludes with claims particularly pointing out and distinctly claiming that which is regarded as the present invention, the advantages of this invention may be more readily ascertained from the following description of the invention when read in conjunction with the accompanying drawings in which:

DETAILED DESCRIPTION OF THE INVENTION

Figure 1:
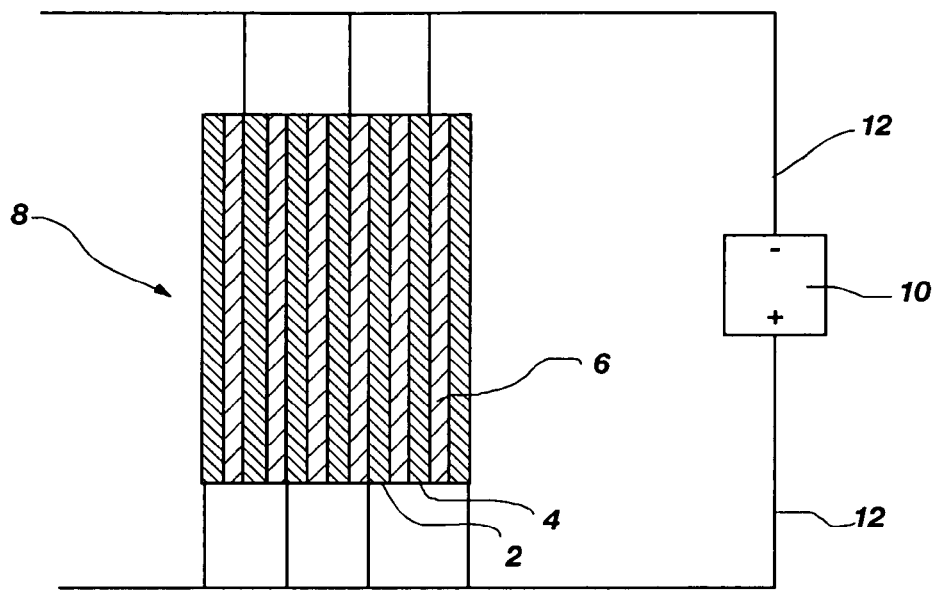
FIG. 1 is a schematic illustration of an embodiment of an electrode assembly connected to a power supply.

A metal film is deposited on a conductive surface of a substrate without electrical contact between the conductive surface and electrodes of an electrode assembly. As such, the metal film is selectively deposited on the conductive surface of the substrate in the form of discrete metal features by noncontact electrochemical deposition. The metal features may be deposited on the conductive surface of the substrate when a fringe electric field, which is generated by applying a voltage across a plurality of positive electrodes and negative electrodes that are connected in series, passes through the conductive surface of the substrate. Conductive polymers or conductive salts may also be deposited on the conductive surface of the substrate rather than the metal film. As shown in FIG. 1, the positive electrodes 2 and the negative electrodes 4 are adjacent to one another and are separated by an interposed insulating material 6. The dimensions of the positive electrodes 2, the negative electrodes 4, and the insulating material 6 are exaggerated for clarity. In addition, only one positive electrode 2, one insulating material 6, and one negative electrode 4 are labeled in FIG. 1 for the sake of clarity. However, it is understood that the positive electrodes 2 and the negative electrodes 4 alternate, with the insulating material 6 separating them. The positive electrodes 2, the negative electrodes 4, and the insulating material 6 form an electrode assembly 8. Since the positive electrodes 2 and negative electrodes 4 are connected in series and are alternated in position, they provide an alternating polarity when the voltage is applied, which, in turn, creates the fringe electric field. As described in detail below, when the voltage is applied, a pattern of the metal film deposited on conductive, negatively charged cathodic portions of the substrate surface corresponds to a pattern of metal features located, sized and configured in correspondence to the location, size and shape of the positive electrodes 2 to selectively form metal features on the substrate. As noted above and described further below, the polarity of positive electrodes 2 and negative electrodes 4 may alternate cyclically if an AC power supply is employed to supply a voltage to electrode assembly 8. However, for simplicity in the initial description of the invention, electrode polarity is described in a fixed manner with the understanding that a DC power supply is employed.

The substrate may be a semiconductor substrate having at least one conductive surface. The semiconductor substrate may be a semiconductor wafer or other bulk substrate that includes a layer of semiconductor material thereon. The term "bulk substrate" as used herein includes not only silicon wafers, but also silicon on insulator ("SOI") substrates, silicon on sapphire ("SOS") substrates, epitaxial layers of silicon on a base semiconductor foundation, and other semiconductor materials, such as silicon-germanium, germanium, ruby, quartz, sapphire, gallium arsenide, and indium phosphide. The conductive surface of the semiconductor substrate may be a seed layer, such as a metal or a conductive metal oxide layer. The seed layer may be a thin layer of the metal that is ultimately to be plated or may be formed from a different metal. The seed layer may be blanket deposited on the semiconductor substrate by conventional techniques, such as by CVD, PVD, ALD, or electroless deposition.

The positive electrodes 2 and the negative electrodes 4 may be formed from an inert, electrical conductive material, such as carbon (graphite or high purity graphite) or a metal inert to the electrochemistry used in the process, such as gold, platinum, or another noble metal. As known in the art, positive electrodes 2 and negative electrodes 4 may be formed in different sizes and shapes and with varying spacing therebetween. Since the pattern of the metal film that is ultimately to be deposited on the conductive surface of the substrate depends on the pattern of the electrodes in the electrode assembly 8, the sizes and the shapes of the positive electrodes 2 may be selected based on the desired pattern of the metal film. Each of the positive electrodes 2 may be a different size or shape or the same size or shape, and the negative electrodes 4 may be cooperatively sized and shaped to provide substantially constant lateral spacing between positive and negative electrodes for substantially uniform fringe electric field intensity.

To prevent shorting between adjacent, oppositely charged electrodes, the insulating material 6 may be a dielectric material that is conventionally used in semiconductor devices, such as borophosphosilicate glass ("BPSG"). The insulating material 6 may also be a synthetic polymer, such as a polyimide, polyketone, polyetherketone, polysulfone, polycarbonate, polystyrene, nylon, polyvinylchloride, polypropylene, polyethersulfone, polyethylene terephthalate, fluoroethylene propylene copolymer, cellulose, triacetate, silicone, or rubber. A thin layer of the insulating material 6 may be used to separate the positive electrodes 2 and the negative electrodes 4, the desirable thickness depending upon spacing or pitch between the electrodes and the dielectric constant. For the sake of example only, the insulating material 6 may be a dielectric epoxy that is applied to a pattern of positive electrodes 2 and the negative electrodes 4, such as by dipping the electrode pattern in the epoxy and etching back the epoxy to expose the electrodes. Alternatively, positive electrodes 2 and negative electrodes 4 may be formed by selectively masking and etching a metal layer on a surface of a dielectric substrate such as, for example, a polyimide or a glass.

Figure 2:
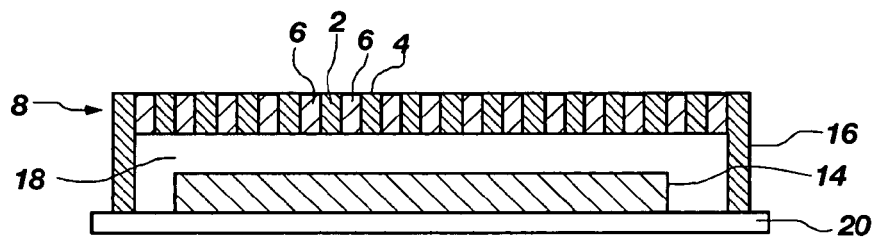
FIGS. 2-4 schematically illustrate a noncontact method of forming a metal film on a conductive surface of a substrate according to the present invention.
Figure 3:
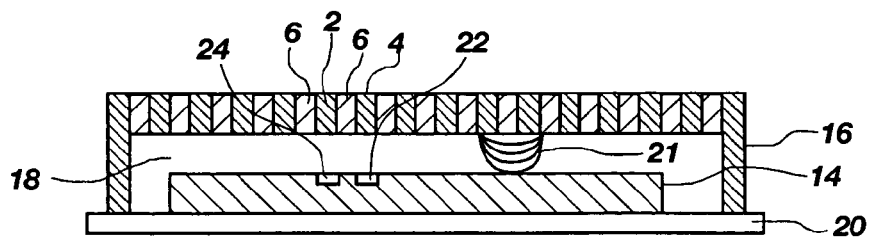
Figure 4:
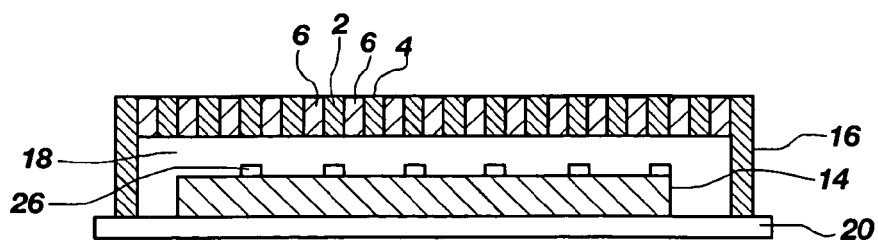

The positive electrodes 2 and the negative electrodes 4 may be connected in series to form the desired pattern of the electrode assembly 8. As previously mentioned, this pattern determines the pattern of the metal film that is ultimately to be deposited on the conductive surface of a substrate 14. For instance, the positive electrodes 2 and the negative electrodes 4 may be configured as a pattern of straight, alternating bars, as shown in FIGS. 2-4, to produce a corresponding or identical pattern of "stripes" of metal film 26 on the conductive surface of substrate 14. However, additional patterns of the positive electrodes 2 and the negative electrodes 4 may be contemplated to form other patterns of the metal film 26 on the conductive surface of substrate 14. The dimensions and spacing between each of the adjacent positive electrodes 2 and the negative electrodes 4 may be adjusted based on the desired pattern of the metal film that is ultimately to be deposited on the conductive surface of substrate 14.

Figure 5:
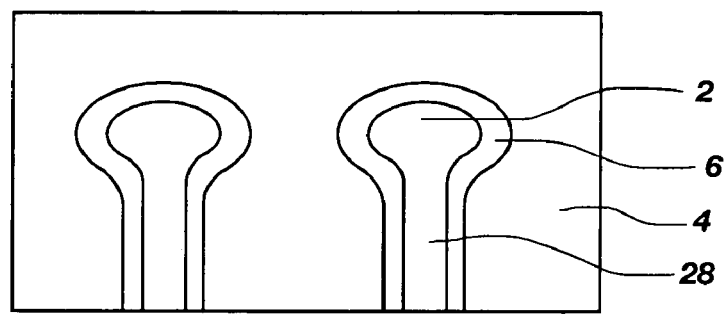
FIG. 5 shows a top elevational view of an additional pattern of the positive electrodes and the negative electrodes in the electrode assembly.

FIG. 5 illustrates an example of an additional pattern in which the positive electrodes 2 and the negative electrodes 4 may be connected. The insulating material 6 may separate the positive electrodes 2 from the negative electrodes 4. The positive electrodes 2 may form a conductive trace shape 28 that corresponds to a metal feature in the form of a conductive trace to be formed on the conductive surface of the substrate 14.

Figure 6:
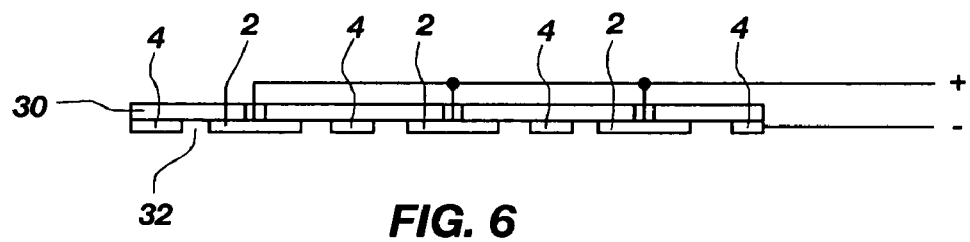
FIGS. 6 and 7 show side views of a pattern of the positive electrodes and the negative electrodes that is used to form bond pads on the conductive surface of the substrate.
Figure 7:
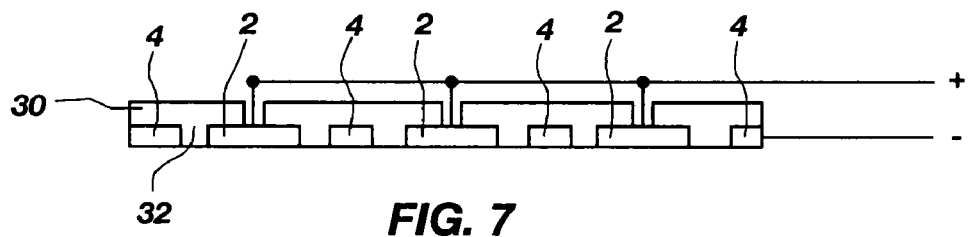
Figure 8:
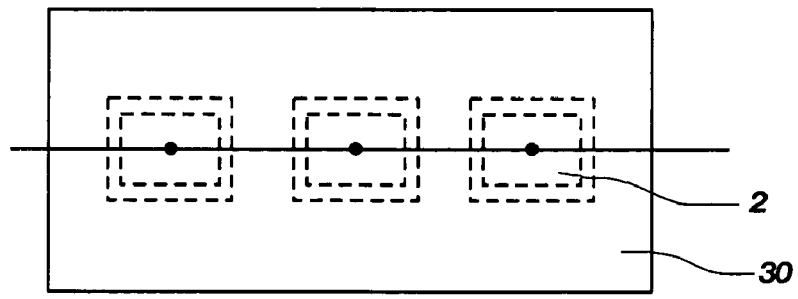
FIG. 8 is a top elevational view of a pattern of the positive electrodes and the negative electrodes that is used to form bond pads on the conductive surface of the substrate.

FIGS. 6-8 show additional examples of patterns in which the positive electrodes 2 and the negative electrodes 4 may be connected to form bond pads on the conductive surface of the substrate 14. The positive electrodes 2 and the negative electrodes 4 may be formed on a surface of a dielectric layer 30, such as a layer of KRYLON® or KAPTON®. As shown in FIGS. 6 and 8, the positive electrodes 2 and negative electrodes 4 may be formed as by selective etching of a conductive layer laminated to a surface of the dielectric layer 30. The positive electrodes are connected to the voltage source by a wiring line extending over dielectric layer 30, while surrounding negative electrode 4 may be merely connected at the edge thereof. The positive electrodes 2 and the negative electrodes 4 may be separated from one another by material of the dielectric layer 30 (see FIG. 7), by an air space 32 (see FIG. 6), or by a combination thereof.

An electroplating system is also disclosed (see FIG. 1). The electroplating system may include the electrode assembly 8 and a power supply 10 selectively operably coupled to the electrode assembly. The positive electrodes 2 and the negative electrodes 4 of electrode assembly 8 may be connected to the power supply 10 through power lines 12. The power supply 10 provides the operating voltage and current to the electrode assembly 8 so that the positive electrodes 2 have a positive potential relative to the negative electrodes 4. The power supply 10 may be a conventional AC power supply or a conventional DC power supply that supplies a voltage ranging from approximately 0.1 volts to approximately 150 volts to the electrode assembly 8. For instance, the voltage supplied to the electrode assembly 8 may range from approximately 0.1 volts to approximately 10 volts. FIG. 1 illustrates a DC connection in which a conventional DC power supply is connected to the electrode assembly 8. It should be noted that in the instance where an AC power supply is employed, the designation of an electrode as a positive or a negative electrode will vary with each polarity reversal of the cycling power supply.

The conductive surface of substrate 14 may be positioned in close proximity to the electrode assembly 8, as shown in FIG. 2. While FIG. 2 shows the electrode assembly 8 positioned over the conductive surface of substrate 14, additional configurations may be contemplated as long as the electrode assembly 8 and the conductive surface of substrate 14 are in close proximity. The substrate 14 may be supported on a holding mechanism, such as a chuck or platen 20, with its conductive surface facing upwardly. A temperature at which the substrate 14 is maintained may depend on the metal of the metal film that is to be deposited on the substrate 14. For the sake of example only, the substrate 14 may be maintained at a temperature of approximately 25° C. For the sake of clarity and convenience, the power supply 10 and the power lines 12 are not shown in FIG. 2. The electrode assembly 8 may be positioned over the conductive surface of substrate 14 through electrode support 16, which may include alignment features for cooperative engagement with alignment features on chuck or platen 20 to provide precise alignment in the X-Y (horizontal) plane and precise rotational alignment about the Z (vertical) axis perpendicular to the X-Y plane with respect to substrate 14 and, for example, a plurality of semiconductor die locations thereon. The distance at which the electrode assembly 8 is desirably positioned from the conductive surface of the substrate 14 may depend on the intensity of the fringe electric field generated and on types and concentrations of electrolytes used in an electrolyte solution 18. This distance may be adjusted to increase or reduce the current densities under the positive electrodes 2 and the negative electrodes 4, which affects a plating rate of the metal film. Since the various positive and negative electrodes may be of different sizes and shapes, lateral distances between peripheries of adjacent positive electrodes 2 and negative electrodes 4 as well as transverse, or vertical, distances of individual positive electrodes 2 and the negative electrodes 4 away from the conductive surface of substrate 14 may also vary. The distance between the positive electrodes 2 and negative electrodes 4 of electrode assembly 8 and the conductive surface of substrate 14 may range from approximately 0.1 mm to approximately 1 cm, such as from approximately 2 mm to approximately 5 mm. By positioning the electrodes of electrode assembly 8 closer to the surface of the conductive surface of substrate 14, the current density under the electrodes may be increased, which increases the plating rate of the metal film under the positive electrodes 2. Conversely, by positioning the electrodes of electrode assembly 8 further from the conductive surface of substrate 14, the current density under the positive electrodes 2 may be decreased to decrease the plating rate of the metal film.

The conductive surface of substrate 14 may be contacted with the electrolyte solution 18 that includes metal ions of the metal film to be deposited. These metal ions may electrodeposit on the conductive surface of substrate 14 under positive electrodes 2 when the electric field is applied. The metal ions may dissociate from a metal salt that is soluble in a liquid medium of the electrolyte solution 18. The liquid medium may be aqueous, may include organic solvents, or may include a mixture of water and organic solvents. The metal ions may be nickel ions, copper ions, cobalt ions, platinum ions, aluminum ions, silver ions, gold ions, chromium ions, iron ions, zinc ions, cadmium ions, palladium ions, platinum ions, tin ions, or bismuth ions. As such, the electrolyte solution 18 may include, but is not limited to, an aqueous solution of nickel sulfate, nickel chloride, copper sulfate, cobalt chloride, or $Pt(NH_3)_2Cl_2$. The electrolyte solution 18 may optionally include acids, surfactants, complexing agents, accelerator additives, suppressor additives, and other conventional ingredients.

To enable the electrolyte solution 18 to flow between the electrode assembly 8 and the conductive surface of substrate 14, the electrode assembly 8 does not directly contact the conductive surface of substrate 14. The electrolyte solution 18 may be applied to the conductive surface of substrate 14 by spraying. Alternatively, the conductive surface of substrate 14 may be immersed in the electrolyte solution 18, such as by immersing the substrate 14 on chuck or platen 20 in an immersion bath that contains the electrolyte solution 18. When the voltage is applied to the electrode assembly 8, the fringe electric field 21 is generated by the alternating polarities of the positive electrodes 2 and the negative electrodes 4, as shown in FIG. 3. For the sake of clarity, one fringe electric field 21 is illustrated in FIG. 3. However, it is understood that multiple fringe electric fields 21 may be present between the alternating positive electrodes 2 and the negative electrodes 4. The fringe electric field 21 may desirably be of sufficient strength to expose the conductive surface of substrate 14 to the electric field. The voltage may be applied through the electrode assembly 8 for an amount of time sufficient to deposit a desired thickness of the metal film on the conductive surface of substrate 14. The metal film may have a thickness ranging from approximately 100 Å to approximately 5 µm. The fringe electric field 21 may pass through the conductive surface of substrate 14, creating localized, anodic portions 22 and cathodic portions 24 on the conductive surface of substrate 14. For instance, a portion of the conductive surface of the substrate 14 beneath the positive electrode 2 acts as a cathode (cathodic portion 24) and a portion of the conductive surface of the substrate 14 beneath the negative electrode 4 acts as an anode (anodic portion 22). The cathodic portion 24 of the conductive surface of substrate 14 has a negative charge while the anodic portion has a positive charge. For the sake of clarity and convenience, one cathodic portion 24 and one anodic portion 22 are illustrated in FIG. 3. However, it is understood that cathodic portions 24 are formed beneath the plurality of positive electrodes 2 and anodic portions are formed beneath the plurality of negative electrodes 4.

The metal ions in the electrolyte solution 18 are attracted to the portions of the conductive surface of substrate 14 having an opposite charge and, therefore, may deposit on the conductive surface of substrate 14 to form the metal film. Since the metal ions in the electrolytic solution have a positive charge, they are attracted to, and may deposit on, the cathodic portions 24 of the conductive surface of substrate 14. As shown in FIG. 4, the metal film 26 may be deposited as discrete metal features in localized areas of the substrate 14 that are positioned below the positive electrodes 2. Therefore, the positive electrodes 2 may be positioned over portions of the conductive surface of substrate 14 that are to be plated with the metal features while the negative electrodes 4 may be positioned over portions of the conductive surface of substrate 14 that are to remain unplated. Since the metal ions are deposited beneath the positive electrodes 2, the metal features may be selectively plated on the desired portions of the conductive surface of substrate 14 by adjusting the sizes and configurations of positive electrodes 2 and their respective positions over the conductive surface of substrate 14.

The metal features formed by the noncontact electroplating method of the present invention may comprise a film of nickel, copper, cobalt, platinum, aluminum, silver, gold, chromium, iron, zinc, cadmium, palladium, platinum, tin, or bismuth. Metal alloys, such as Sn/Ni, NiWP, CoWP, or Cu/Zn, may also be formed. In one embodiment, the metal film is a film of nickel, copper, cobalt, or platinum. Of course, multiple metal layers may be deposited in superimposition by using the same pattern for electrode assembly with different electrolyte solutions 18 in different reservoirs.

By selectively depositing the metal features, the conductive surface of substrate 14 may not include metal film portions extraneous to metal features thereon, which would require subsequent removal. In addition, since the positive electrodes 2 and the negative electrodes 4 are not attached to the conductive surface of substrate 14 by mechanical electrical contacts, potential defects in the electrode attachments, a concern with prior art techniques, cannot occur. Control of electroplating the metal features is also enhanced compared to conventional electroless plating techniques. Furthermore, since the electric field is located adjacent to the portion of the conductive surface of substrate 14 that is to be plated, the metal features may be uniformly and consistently deposited. The noncontact electroplating method may also enable the selective deposition of the metal features without using a mask. Since the metal features are deposited selectively, a mask is not required to cover portions of the conductive surface of substrate 14 that are to remain unplated. Instead, after plating is completed, unplated portions of the seed layer comprising the conductive surface may be easily removed by a selective solvent. The solvent may be chosen by one of ordinary skill in the art based on the materials used in the seed layer and in the substrate 14.

As described above, in one embodiment, the electrode assembly 8 is attached to a DC power supply to selectively deposit the metal features on the conductive surface of substrate 14. In another embodiment, the metal features are deposited over areas of the conductive surface of substrate 14 proximate and beneath each electrode 2 and 4 by attaching the electrodes 2 and 4 of electrode assembly 8 to an AC power supply. In this situation, wherein power supply 10 comprises an AC power supply operably coupled to electrodes 2 and 4 in the same manner as the DC power supply previously described with respect to FIG. 1, the polarity of electrodes 2 and 4 varies and metal features may be deposited under both electrodes 2 and electrodes 4 because the polarities of the electrodes reverse with each cycle of the AC power supply. For instance, during one cycle of the AC power supply, the electrodes 2 may exhibit a positive polarity while the electrodes 4 may exhibit a negative polarity. However, during a second, reverse AC power cycle, the polarities of the electrodes are reversed. Due to the cycling of the AC power supply, portions of the conductive surface of substrate 14 under the electrodes 2 or under the electrodes 4 may be negatively charged and comprise a cathodic portion 24. In other words, at different points in time, portions of the conductive surface of substrate 14 beneath the electrodes 2 or beneath the electrodes 4 have a negative charge upon which the metal ions from electrolyte solution 18 may deposit to form the metal features. Accordingly, an AC power supply may be used to plate metal features in closer proximity (smaller spacing or pitch) on the conductive surface of substrate 14 that is positioned beneath the electrode assembly 8 than if a DC power supply is employed. Using the present invention may enable the metal features to be deposited more uniformly over larger portions of the conductive surface of substrate 14 than with prior art techniques employing electrode edge connections at a wafer periphery, which result in a drop in potential toward the wafer center. The noncontact electroplating process of the present invention may be used to form metal features on the conductive surface of substrate 14 including, but not limited to, bond pads, traces and damascene structures. Electroplating such metal features is one of many steps in fabricating the integrated circuits. As such, the electroplating process of the present invention may be used to form intermediate semiconductor device structures. By using the noncontact electroplating process of the present invention, the bond pads may be selectively formed on the conductive surface of substrate 14 without undesirably plating the metal film 26 on other portions of the substrate 14. The noncontact electroplating process may also be used to form metal interconnects of the damascene structures. By selectively plating the metal interconnects, subsequent polishing steps to remove extraneous film may be reduced or eliminated. The fabrication of the damascene structures is known in the art and, therefore, is not discussed in detail herein.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A method of electroplating a semiconductor substrate, comprising:

positioning an electrode assembly over a conductive surface of a substrate, the electrode assembly comprising a plurality of adjacent, mutually spaced and electrically isolated electrodes connected in series so as to be oppositely polarized when a voltage is applied thereacross;

applying an electrolyte solution to the conductive surface of the substrate;

applying a voltage to the plurality of adjacent, mutually spaced and electrically isolated electrodes while the electrode assembly and the conductive surface of the substrate are maintained in a stationary position relative to one another; and electrodepositing discrete metal features on portions of the conductive surface of the substrate positioned beneath electrodes of the plurality of adjacent, mutually spaced and electrically isolated electrodes exhibiting a positive polarity while portions of the conductive surface of the substrate positioned beneath electrodes of the plurality of adjacent, mutually spaced and electrically isolated electrodes exhibiting a negative polarity remain unplated.

2. The method of claim 1, further comprising disposing an insulating material between each of the plurality of adjacent electrodes.

3. The method of claim 1, wherein positioning the electrode assembly over the conductive surface of the substrate comprises positioning the plurality of adjacent, mutually spaced and electrically isolated electrodes in close proximity to the conductive surface of the substrate without the plurality of adjacent, mutually spaced and electrically isolated electrodes contacting the conductive surface of the substrate.

4. The method of claim 1, wherein positioning the electrode assembly over the conductive surface of the substrate comprises positioning the electrodes of the plurality of adjacent, mutually spaced and electrically isolated electrodes exhibiting the positive polarity over portions of the conductive surface of the substrate upon which the discrete metal features are to be formed.

5. The method of claim 1, wherein positioning the electrode assembly over the conductive surface of the substrate comprises positioning the electrodes of the plurality of adjacent, mutually spaced and electrically isolated electrodes exhibiting a negative polarity over portions of the conductive surface of the substrate that are to remain unplated.

6. The method of claim 1, wherein positioning the electrode assembly over the conductive surface of the substrate comprises positioning the plurality of adjacent, mutually spaced and electrically isolated electrodes from approximately 0.1 mm to approximately 1 cm away from the conductive surface of the substrate.

7. The method of claim 1, wherein positioning the electrode assembly over the conductive surface of the substrate comprises positioning the plurality of adjacent, mutually spaced and electrically isolated electrodes from approximately 2 mm to approximately 5 mm away from the conductive surface of the substrate.

8. The method of claim 1, wherein applying the electrolyte solution to the conductive surface of the substrate comprises applying the electrolyte solution comprising metal ions selected from the group consisting of nickel ions, copper ions, cobalt ions, platinum ions, aluminum ions, silver ions, gold ions, chromium ions, iron ions, zinc ions, cadmium ions, palladium ions, platinum ions, tin ions, and bismuth ions.

9. The method of claim 1, wherein applying the electrolyte solution to the conductive surface of the substrate comprises applying the electrolyte solution selected from the group consisting of nickel sulfate, nickel chloride, copper sulfate, cobalt chloride, and $Pt(NH_3)_2Cl_2$.

10. The method of claim 1, wherein applying the voltage to the plurality of adjacent, mutually spaced and electrically isolated electrodes while the electrode assembly and the conductive surface of the substrate are maintained in a stationary position relative to one another comprises generating a fringe electrical field of a magnitude to pass through the conductive surface of the substrate.

11. The method of claim 1, wherein applying the voltage to the plurality of adjacent, mutually spaced and electrically isolated electrodes while the electrode assembly and the conductive surface of the substrate are maintained in a stationary position relative to one another comprises connecting the plurality of adjacent, mutually spaced and electrically isolated electrodes to a DC power supply.

12. The method of claim 1, wherein applying the voltage to the plurality of adjacent, mutually spaced and electrically isolated electrodes while the electrode assembly and the conductive surface of the substrate are maintained in a stationary position relative to one another comprises connecting the plurality of adjacent, mutually spaced and electrically isolated electrodes to an AC power supply.

13. The method of claim 1, wherein applying the voltage to the plurality of adjacent, mutually spaced and electrically isolated electrodes while the electrode assembly and the conductive surface of the substrate are maintained in a stationary position relative to one another comprises forming cathodic portions on the conductive surface of the substrate beneath the electrodes of the plurality exhibiting the positive polarity and forming anodic portions on the conductive surface of the substrate beneath the electrodes of the plurality exhibiting a negative polarity.

14. The method of claim 1, wherein electrodepositing discrete metal features on portions of the conductive surface of the substrate positioned beneath the electrodes of the plurality exhibiting the positive polarity comprises selectively depositing the metal features on cathodic portions of the conductive surface of the substrate.

15. The method of claim 14, wherein selectively depositing the metal features on the cathodic portions of the conductive surface of the substrate comprises operably coupling the plurality of adjacent, mutually spaced and electrically isolated electrodes to a DC power supply.

16. The method of claim 1, wherein electrodepositing the discrete metal features on the portions of the conductive surface of the substrate comprises operably coupling the plurality of adjacent, mutually spaced and electrically isolated electrodes to an AC power supply.

17. The method of claim 1, wherein electrodepositing the discrete metal features on portions of the conductive surface of the substrate positioned beneath the electrodes of the plurality exhibiting a positive polarity comprises forming the metal features from at least one of nickel, copper, cobalt, platinum, aluminum, silver, gold, chromium, iron, zinc, cadmium, palladium, platinum, tin, and bismuth.

18. The method of claim 1, wherein electrodepositing the discrete metal features on portions of the conductive surface of the substrate positioned beneath the electrodes of the plurality exhibiting a positive polarity comprises forming the metal features from at least one of nickel, copper, cobalt, and platinum.

19. A method of electroplating a semiconductor substrate, comprising:
positioning an electrode assembly over a conductive surface of a substrate, the electrode assembly comprising a plurality of adjacent, mutually spaced and electrically isolated electrodes connected in series so as to be oppositely polarized when a voltage is applied thereacross;
applying an electrolyte solution to the conductive surface of the substrate;
applying a voltage to the plurality of adjacent, mutually spaced and electrically isolated electrodes while the electrode assembly is stationary over the conductive surface of the substrate; and electrodepositing discrete metal features on portions of the conductive surface of the substrate positioned beneath electrodes of the plurality of adjacent, mutually spaced and electrically isolated electrodes exhibiting a positive polarity.

* * * * *

UNITED STATES PATENT AND TRADEMARK OFFICE
CERTIFICATE OF CORRECTION

PATENT NO. : 7,435,324 B2
APPLICATION NO. : 10/933823
DATED : October 14, 2008
INVENTOR(S) : Ramarajan et al.

It is certified that error appears in the above-identified patent and that said Letters Patent is hereby corrected as shown below:

In column 9, line 55, in Claim 2, after "of the" delete "plurality of" and insert -- at least three --, therefor.

In column 9, line 55, in Claim 2, delete "adjacent" and insert -- adjacent, mutually spaced and electrically isolated --, therefor.

Signed and Sealed this

Twenty-fourth Day of March, 2009

JOHN DOLL
*Acting Director of the United States Patent and Trademark Office*